United States Patent [19]
Hattangadi

[11] Patent Number: 5,087,835
[45] Date of Patent: Feb. 11, 1992

[54] POSITIVE EDGE TRIGGERED SYNCHRONIZED PULSE GENERATOR

[75] Inventor: Rajiv M. Hattangadi, Austin, Tex.

[73] Assignee: Advanced Micro Devices, Inc., Sunnyvale, Calif.

[21] Appl. No.: 666,101

[22] Filed: Mar. 7, 1991

[51] Int. Cl.$^5$ .................. H03K 17/16; H03K 19/03
[52] U.S. Cl. .................. 307/443; 307/572; 307/265; 307/269
[58] Field of Search .............. 307/231, 443, 234, 572, 307/518, 265, 269; 328/108

[56] References Cited
U.S. PATENT DOCUMENTS
4,864,158 9/1989 Koelle et al. .................. 307/231

Primary Examiner—David Mis
Attorney, Agent, or Firm—Davis Chin

[57] ABSTRACT

A pulse generator for generating an output pulse which is synchronized to an internal clock pulse includes a detector latch circuit (24), a master latch (12), a clocked latch (14), a first clocked half-latch (16), and an output logic circuit (18). Th detector latch (24) is responsive only to the positive edge of the asynchronous pulse of a varying width for generating a trigger signal which is latched to a low logic level. The master latch (12) is responsive to the trigger signal for generating a first latched signal which is latched to a high logic level. The clocked latch means (14) is responsive to the first latched signal and a first internal clock pulse signal for generating a second latched signal which is latched to a high logic level. The first clocked half-latch (16) is responsive to the second latched signal and a second internal clock pulse signal for generating a control signal. The output logic circuit (18) is responsive to the first internal clock pulse signal and the control signal for generating an output pulse signal which is synchronized to the first internal clock pulse signal when the control signal is at a low logic level. A clearing circuit (19) is provided and is responsive to the control signal and the first internal clock pulse signal for generating a clearing signal which resets the first latched signal to a low logic level at the output of the master latch.

20 Claims, 3 Drawing Sheets

POSITIVE EDGE TRIGGERED SYNCHRONIZED PULSE GENERATOR

BACKGROUND OF THE INVENTION

This invention relates generally to digital integrated circuits for use in data processing computing systems and the like and more particularly, it relates to a pulse generator which is responsive only to the positive edge of an asynchronous pulse of a varying width for generating an output pulse that is synchronized to an internal clock pulse.

As is generally well known, in the field of electronic digital computing systems there is typically required the use of a microprocessor which contains numerous logic circuitry including latches, flip-flops and other storage devices. Further, the microprocessor is usually built around internally-generated signals or clock pulses which are utilized to control the timing of when certain process operations are to be performed and when data information are to be transferred. The nature of clock pulses used within the microprocessor is critical to its performance. Thus, these clocked signals are delivered to all parts of the system so that each step in the process will operate internally in a synchronous manner in relationship to the internal clock pulses.

However, many times the microprocessor will be required to interface with other integrated circuits which generates asynchronous pulse signals having variable pulse widths that occurs at different times and operates independently with respect to the timing of the internal clock pulses. As a result, the asynchronous pulse signals received by the logic circuitry may cause false triggering of the storage devices, i.e., the latches or flip-flop, and thus effect the storing of a wrong or incorrect logic state.

Accordingly, there has arisen a need of a pulse generator which receives asynchronous pulses of a varying width and generates an output pulse that is synchronized to an internal clock pulse so as to eliminate false triggering and thus allows reliable and accurate data information to be stored in the various storage devices. It would be expedient to form the pulse generator with a minimal number of component parts so as to not only improve the yield and increase the logic function density on the semiconductor integrated circuits, but also to reduce the power consumption for performance of the logic functions involved.

SUMMARY OF THE INVENTION

Accordingly, it is a general object of the present invention to provide a positive edge triggered synchronized pulse generator which is relatively simple and economical to manufacture and assemble.

It is an object of the present invention to provide a positive edge triggered synchronized pulse generator which is formed of a minimal number of component parts.

It is another object of the present invention to provide a pulse generator which is responsive only to the positive edge of an asynchronous pulse of a varying width for generating an output pulse that is synchronized to an internal clock pulse.

It is still another object of the present invention to provide a pulse generator which includes a detector latch circuit, a master latch, a clocked latch, a first clocked half-latch, and an output logic circuit.

In accordance with these aims and objectives, the present invention is concerned with the provision of a pulse generator for generating an output pulse that is synchronized to an internal clock pulse. The pulse generator includes a detector latch circuit, a master latch, a clocked latch, a first clocked half-latch, and an output logic circuit. The detector latch circuit is responsive only to the positive edge of an asynchronous pulse of a varying width for generating a trigger signal which is latched to a low logic level. The master latch is responsive to the trigger signal for generating a first latched signal which is latched to a high logic level. The clocked latch is responsive to the first latched signal and a first internal clock pulse signal for generating a second latched signal which is latched to a high logic level. The first clocked half-latch is responsive to the second latched signal and a second internal clock pulse signal for generating a control signal. The output logic circuit is responsive to the first internal clock pulse signal and the control signal for generating an output pulse signal which is synchronized to the first internal clock pulse signal when the control signal is at a low logic level.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Figure 1:
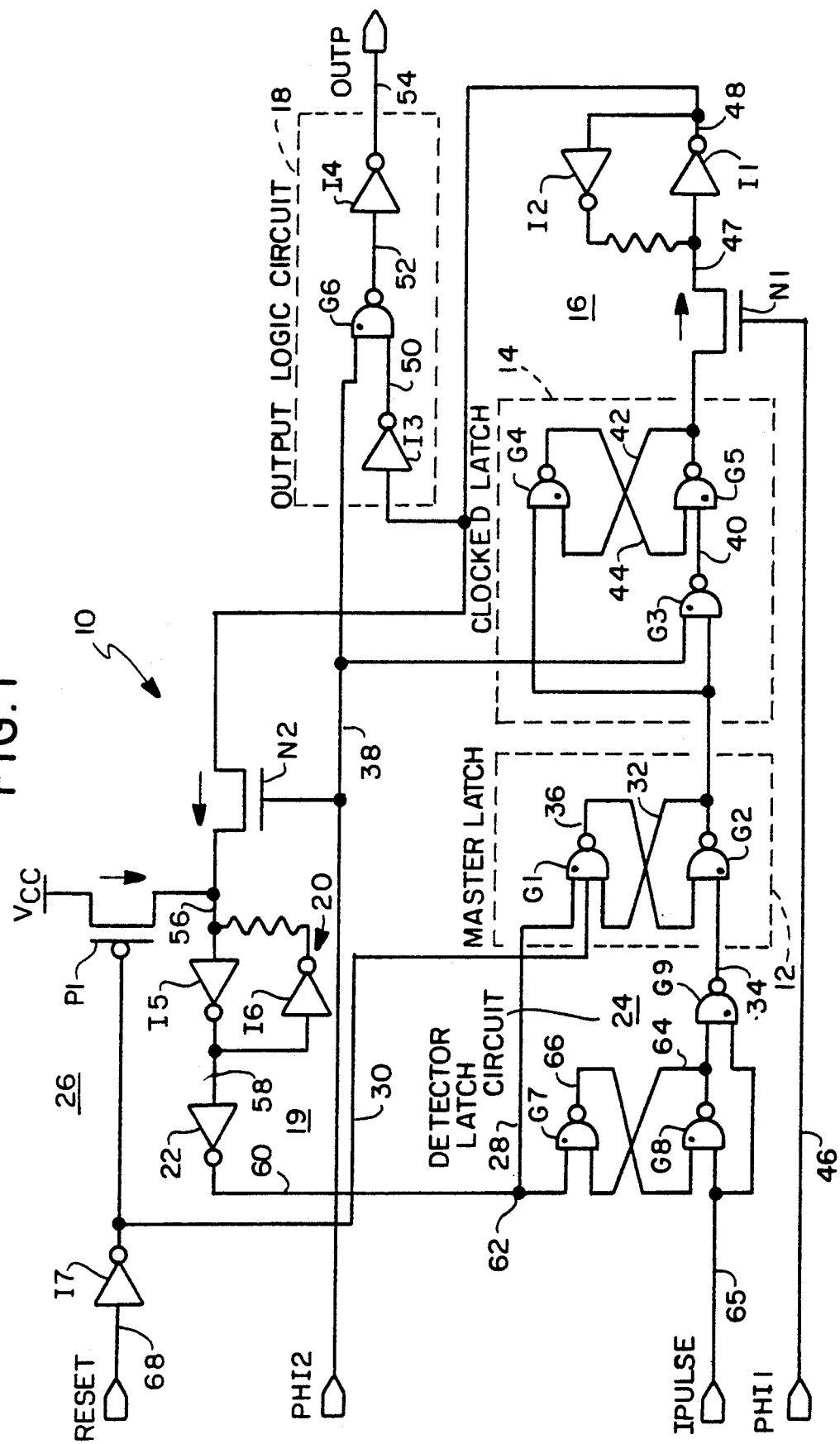
FIG. 1 is a schematic circuit diagram of a pulse generator, constructed in accordance with the principles of the present invention.

Referring now in detail to the drawings, there is shown in FIG. 1 a schematic circuit diagram of a pulse generator 10 which is constructed in accordance with the principles of the present invention. The pulse generator 10 is responsive only to the positive edge (low-to-high transition) of an asynchronous pulse IPULSE of a varying width for generating an output pulse OUTP which is synchronized to an internal clock pulse PHI2. The pulse generator 10 includes a master latch 12, a clocked latch 14, a first clocked half-latch 16, and an output logic circuit 18. The pulse generator also includes a clearing circuit 19 formed of a second clocked half-latch 20 and an inverter 22; a detector latch circuit 24; and a reset circuit 26.

The master latch 12 is formed of a pair of cross-coupled NAND logic gates G1 and G2. One input of the NAND gate G1 is connected to receive a clearing signal CL on line 28. A second input of the NAND gate G1 is connected to receive a reset signal $\overline{\text{RESET}}$ on line 30 from the reset circuit 26. A third input of the gate G1 is connected to the output of the gate G2 on line 32. One input of the NAND gate G2 is connected to the output of the detector latch circuit 24 on line 34. The other input of the gate G2 is connected to the output of the gate G1 on line 36. The output of the gate G2 defines the output of the master latch 12 and provides a first latched signal L1.

The clocked latch 14 consists of a NAND logic gate G3 and a pair of cross-coupled NAND logic gates G4, G5. The NAND gate G3 has a first input connected to receive the internal clock pulse PHI2 on line 38, a second input connected to the output of the master latch 12 on the line 32, and an output on line 40. The NAND gate G4 has a first input connected also to the output of the master latch 12 on the line 32 and a second input connected to the output of the gate G5 on line 42. The NAND gate G5 has a first input connected to the output of the gate G4 on line 44 and a second input connected to the output of the gate G3. The output of the gate G5 on the line 42 defines the output of the clocked latch 14 and provides a second latched signal L2.

The first clocked half-latch 16 consists of an N-channel MOS pass transistor N1 and inverters I1, I2. The pass transistor N1 has its drain connected to the output of the clocked latch 14 on the line 42, its source connected to the input of the inverter I1 on line 47, and its gate connected to receive an internal clock pulse PHI1 on line 46. The output of the inverter I1 on line 48 defines the output of the half-latch 16 and provides a control signal CS. The output of the inverter I1 is connected to the input of the inverter I2. The output of the inverter I2 is connected to the source of the pass transistor N1 and to the input of the inverter I1.

The output logic circuit 18 is comprised of an inverter I3, a NAND logic gate G6, and an inverter I4. The inverter I3 has its input connected to the output of the half-latch 16 on line 48 for receiving the control signal CS and its output connected to a first input of the gate G6 on line 50. A second input of the gate G6 is connected to receive the internal clock pulse PHI2 on the line 38. The inverter I4 has its input connected to the output of the gate G6 on line 52 and its output connected to a line 54 for providing the synchronized output pulse OUTP.

The clearing circuit 19 includes the second clocked half-latch 20 and the inverter 22. The second clocked half-latch 20 consists of an N-channel MOS pass transistor N2 and inverters I5, I6. The pass transistor N2 has its drain connected to the output of the first half-latch 16 on the line 48, its source connected to the input of the inverter I5 on line 56, and its gate connected to receive the internal clock pulse PHI2 on the line 38. The output of the inverter I5 on line 58 defines the output of the half-latch 20 and is connected to the input of the inverter I6. The output of the inverter I6 is connected to the source of the pass transistor N2 and to the input of the inverter I5. The inverter 22 has its input connected to the output of the half-latch 20 on line 58 and its output on line 60 connected to an internal node 62. The output of the inverter 22 provides the clearing signal CL.

The detector latch circuit 24 is comprised of a pair of cross-coupled NAND logic gates G7, G8 and a NAND logic gate G9. The NAND gate G7 has a first input connected to the output of the inverter 22 on the line 60 and at the node 62. A second input of the gate G7 is connected to the output of the gate G8 on line 64. The gate G8 has a first input connected to the output of the gate G7 on line 66 and a second input connected to receive the synchronous pulse IPULSE on line 65 which has varying width. The gate G9 has a first input connected to the output of the gate G8 on the line 66 and a second input connected also to receive the asynchronous pulse IPULSE. The output of the gate G9 on the line 34 defines the output of the detector latch circuit 24 and provides a trigger signal TS.

The reset circuit 26 includes an inverter I7 and a P-channel MOS transistor P1. The inverter I7 has its input connected to receive a reset signal RESET on line 68 and its output connected to the gate of the transistor P1. The output of the inverter I7 provides the reset signal $\overline{RESET}$ on the line 30. The transistor P1 has it source connected to a supply potential or voltage VCC, which is typically at +5.0 volts, and its drain connected to the input of the second half-latch 20 on the line 56.

Figure 2:
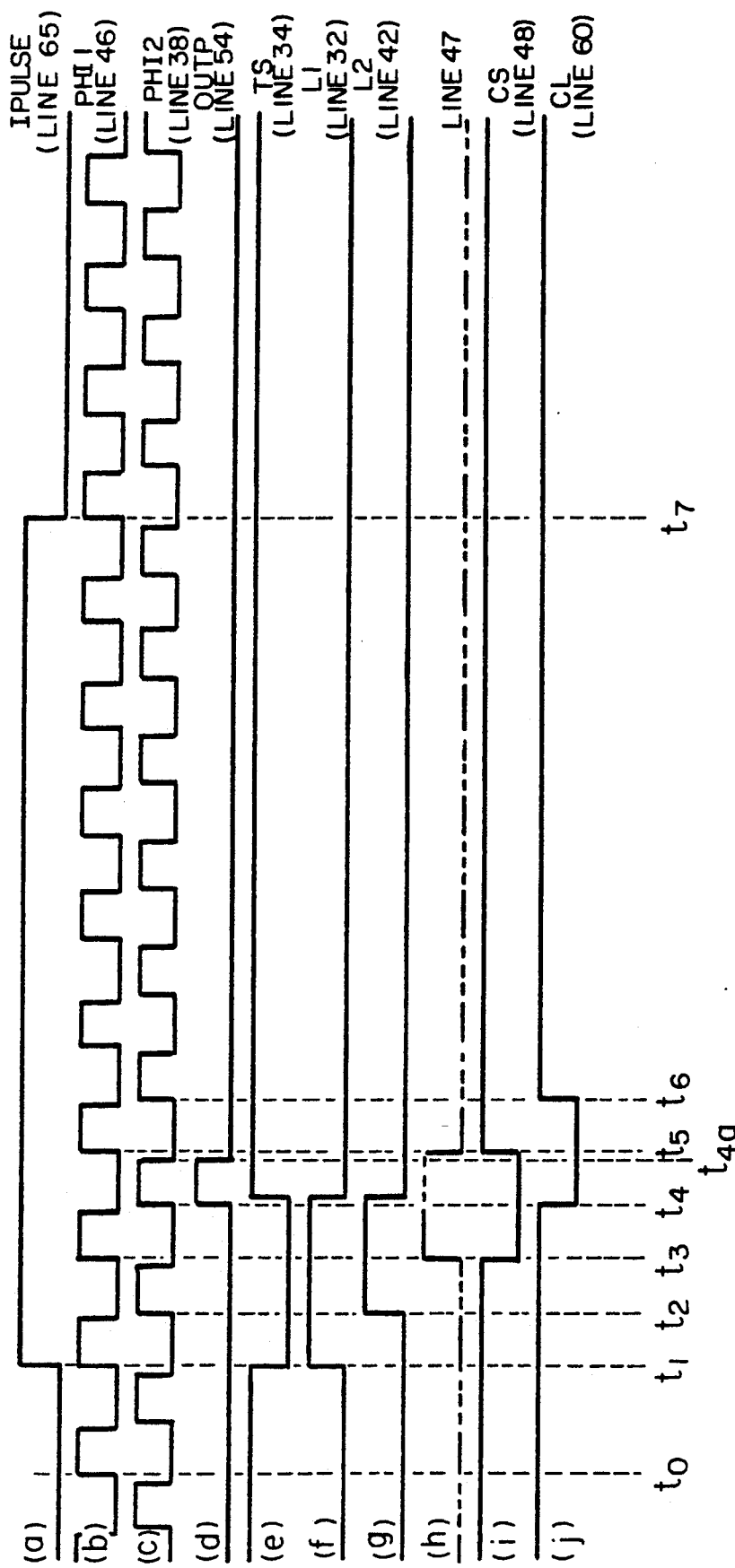
FIGS. 2(a)-2(j) are waveforms at various points in the pulse generator circuit of FIG. 1, which are useful in explaining the operation thereof when an asynchronous pulse having a broad width is received.

In order to facilitate the understanding of the normal operation of the pulse generator 10 of FIG. 1 when the asynchronous pulse IPULSE having a broad width is received, reference is now made to the waveforms illustrated in FIGS. 2(a) through 2(j). Initially, it is assumed that the reset signal RESET consisting of a short positive pulse has been applied to the line 68 at time $t\phi$. When the reset signal RESET makes a low-to-high transition, this causes the output of the NAND gate G1 to be set at a high or logic "1" level. Since the asynchronous pulse IPULSE is at a low logic level at the time $t\phi$ as shown in FIG. 2(a), the output of the NAND gate G9 will also be set at a high or logic "1" level. This is illustrated in FIG. 2(e). Thus, the output of the gate G2 defining the output of the master latch 12 will be reset to a low level. This is further illustrated in FIG. 2(f). This low level from the output of the master latch 12 will, in turn, cause the output of the gate G5 defining the output of the clocked latch 14 to be also reset to the low logic level, as illustrated in FIG. 2(g).

Further, the reset signal RESET being at the high logic level will turn on the transistor P1, causing the node 62 (FIG. 2(j)) to be at a high logic level initially. Since the output of the gate G8 will also be high, the output of the gate G7 on the line 64 will be low. In addition, the low at the output of the gate G5 will have been passed through the pass transistor N1, due to the internal clock pulse PHI1, to the output of the inverter I3. As a result, the output pulse OUTP will be at a low logic level at the time $t\phi$ as depicted in FIG. 2(d). It will be noted that the internal clock pulses PHI1 and PHI2 are illustrated in respective FIGS. 2(b) and 2(c) and are of the non-overlapping type.

At the time t1, the asynchronous pulse IPULSE goes to a high or logic "1" level as illustrated in FIG. 2(a). This positive edge (low-to-high transition) of the asynchronous pulse will be sensed by the detector latch circuit 24 so as to cause the output of the gate G9 to change to the low or logic "$\phi$" level as depicted in FIG. 2(e). The high-to-low transition at the output of the detector latch circuit 24 on the line 34 is referred to as the trigger signal TS. This trigger signal TS will, in turn, cause the output of the gate G2 (line 32) defining the first latched signal L1 to make a low-to-high transition as depicted in FIG. 2(f). Therefore, the positive edge of the asynchronous pulse has been sensed by the detector latch circuit and has been latched at the output of the master latch 12.

When the internal clock pulse PHI2 goes high at the time t2, the output of the gate G3 will go low causing the output of the gate G5 (line 42) defining the second latched signal L2 to go high. This is illustrated in FIG. 2(g). Consequently, the first latched signal L1 being high from the master latch will be now latched into the clocked latch 14. At time t3 when the internal clock pulse PHI1 goes high, the half-latch 16 will be transparent so as to allow the high logic level at the output of the gate G5, which is passed through the pass transistor N1, to reach the output of the inverter I1. The high level at the output of the pass gate N1 and the inverted signal at the output of the inverter I1 (line 48) defining the control signal CS are shown in FIGS. 2(h) and 2(i), respectively. Due to the inverter I3, the output on line 50 will now be at a high logic level.

When the next internal clock pulse PHI2 goes to a high level at time t4, the output of the gate G6 on line 52 will go low and will be inverted by the inverter I4 so as to produce the rising edge of the output pulse OUTP as shown in FIG. 2(d). When the clock pulse PHI2 goes to the low level at time t4a, the output of the gate G6 will go back to the high level and will again be inverted by the inverter 14 so as to produce the falling edge of the output pulse OUTP on the line 54. Thus, it can be seen that this output pulse OUTP has been synchronized to the internal clock pulse PHI2.

Simultaneously, at the time t4, the second half-latch 20 will be transparent so as to allow the low logic level at the output of the first half-latch 16 on the line 48, which is passed through the pass transistor N2, to reach the output of the inverter I5. Due to the inverter 22, a low logic clearing signal CL will be applied to the input of the detector latch 24 and also to the input of the master latch 12 via the node 62. This low logic clearing signal CL is illustrated in FIG. 2(j). With the clearing signal being at the low logic level, this causes the output of the gate G7 in the detector latch circuit to go to a high logic level. Since the asynchronous pulse IPULSE is still at the high logic level at the time t4, the output of the gate G8 will go to a low logic level, causing the trigger signal TS at the output of the gate G9 on the line 34 to go back to a high logic level as illustrated in FIG. 2(e).

This clearing signal will also cause the output of the gate G1 in the master latch 12 to go to a high logic level. Since the output of the detector latch circuit 24 is also at the high logic level, the output of the master latch at the output of the gate G2 defining the first latched signal L1 will be reset to the low logic level. This can be seen from FIG. 2(f). This will, in turn, cause the outputs of the gates G3 and G4 to go high so as to reset the second latched signal L2 at the output of the clocked latch 14 (output of the gate G5) to a low level as shown in FIG. 2(g).

When the next internal clock pulse PHI1 goes high at the time t5, the low level from the clocked latch 14 will be passed through the pass transistor N1 to the line 47 and will be subsequently latched to a high logic level on the line 48 defining the control signal CS. Again, the outputs on the lines 47 and 48 are shown in FIGS. 2(h) and 2(i). When the next internal clock pulse PHI2 goes high at the time t6, the high level from the output of the first clocked-latch 16 will be passed through to the second clocked half-latch 20 and the inverter 22 so as to reset the clearing signal CL back to the high logic level at the node 62. It should be noted that the negative or falling edge of the present wide asynchronous pulse IPULSE that occurs at the time t7 will not affect the operation of the pulse generator. In particular, since the high-to-low transition at the time t7 of the asynchronous pulse will have no effect on the input of detector latch 24, the output on the line 34 is maintained at the high logic level. Therefore, no other events will occur.

In FIGS. 3(a) through 3(j), there are illustrated the waveforms generated when the pulse generator 10 of FIG. 1 receives an asynchronous pulse IPULSEI having a narrow width. As can be seen from FIG. 3(a), the positive edge of the asynchronous pulse IPULSEI occurs again at the time t1 but the negative edge happens at time t1a before the internal clock pulse PHI2 goes high at the time t2. However, since the low-to-high transition of the asynchronous pulse IPULSEI causes the trigger signal CS at the output of the gate G9 on the line 34 to go low, this low level trigger signal will cause the first latched signal L1 (high) to be latched in the master latch 12.

Figure 3:
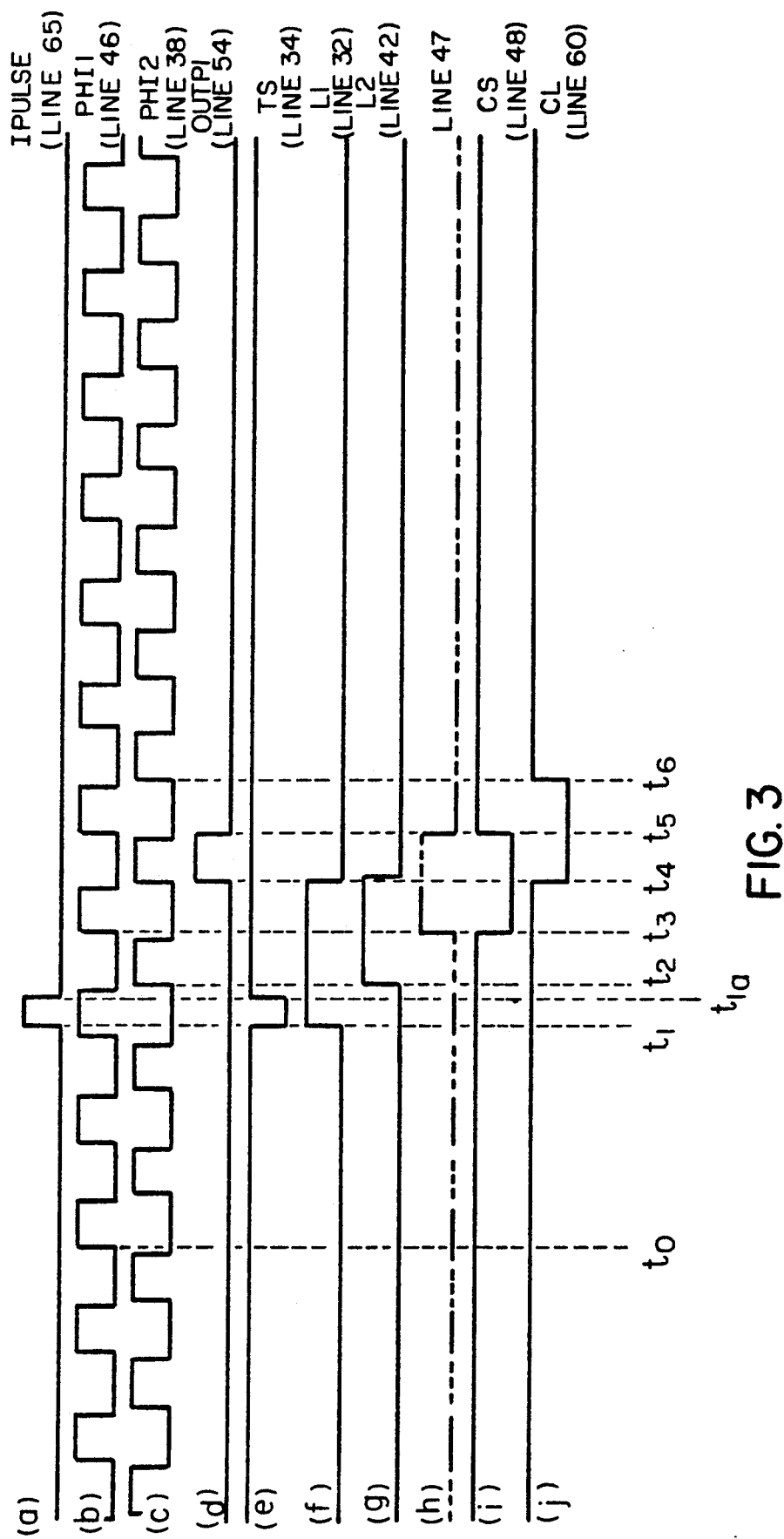
FIGS. 3(a)-3(j) are waveforms at various points in the pulse generator circuit of FIG. 1, which are useful in explaining the operation thereof when an asynchronous pulse having a narrow width is received.

Therefore, the high-to-low transition of the asynchronous pulse IPULSEI at the time t1a will only cause the output of the gate G9 to be returned to the high logic level and does not affect the operation of the master latch 12. This is illustrated in FIG. 3(e). Since the further operation of the master latch 12 will not occur until it has been reset by the low level clearing signal CL at the node 62, the remaining events and the waveforms shown in FIGS. 3(f) and 3(j) are identical as described above in connection with FIGS. 2(f) and 2(j). Consequently, the detailed operation shown in FIGS. 3(f) and 3(j) will not be repeated. However, it should be apparent to those skilled in the art that the output pulse OUTPI will again be produced at the line 54 which is synchronized with respect to the internal clock pulse PHI2. Moreover, it should be clearly understood that the output pulse may be produced so as to be synchronized with respect to the internal clock pulse PHI1 by reversing the signal on the line 38 with the signal on the line 46.

From the foregoing detailed description, it can thus be seen that the present invention provides a pulse generator which is responsive only to the positive edge of an asynchronous pulse of a varying width for generating an output pulse that is synchronized to an internal clock pulse. The pulse generator includes a detector latch circuit, a master latch, a clocked latch, a first clocked half-latch, and an output logic circuit.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A pulse generator for generating an output pulse which is synchronized to an internal clock pulse, comprising:

detector latch circuit means (24) responsive only to the positive edge of an asynchronous pulse of a varying width for generating a trigger signal which is latched to a low logic level;

master latch means (12) responsive to said trigger signal for generating a first latched signal which is latched to a high logic level;

clocked latch means (14) responsive to said first latched signal and a first internal clock pulse signal for generating a second latched signal which is latched to a high logic level;

first clocked half-latch means (16) responsive to said second latched signal and a second internal clock pulse signal for generating a control signal; and output logic circuit means (18) responsive to said first internal clock pulse signal and said control signal for generating an output pulse signal which is synchronized to said first internal clock pulse signal when control signal is at a low logic level.

2. A pulse generator as claimed in claim 1, wherein said master latch means (12) is further responsive to a clearing signal having a low logic level for resetting said first latched signal to a low logic level when said control signal is latched at a low logic level.

3. A pulse generator as claimed in claim 2, wherein said clocked latch means (14) is responsive to the low logic level of said first latched signal for resetting said second latched signal to a low logic level.

4. A pulse generator as claimed in claim 3, further comprising clearing circuit means (19) responsive to said control signal and said first internal clock pulse signal for generating said clearing signal.

5. A pulse generator as claimed in claim 4, wherein said detector latch means (24) is also responsive to the low logic level of said clearing signal for resetting said trigger signal to a high logic level if said asynchronous pulse is still maintained in the high logic level, said trigger signal being reset to the high logic level by the negative edge of said asynchronous pulse when it occurs before the low logic level of said clearing signal.

6. A pulse generator as claimed in claim 5, wherein said master latch means (12) comprises first and second cross-coupled NAND logic gates (G1, G2).

7. A pulse generator as claimed in claim 6, wherein said clocked latch means (14) comprises a third NAND logic gate (G3) and fourth and fifth cross-coupled NAND logic gates (G4, G5).

8. A pulse generator as claimed in claim 7, wherein said first clocked half-latch means (16) comprises a pass transistor (N1) and first and second inverter (I1, I2).

9. A pulse generator as claimed in claim 8, wherein said output logic means (18) comprises a third inverter (I3), a sixth NAND logic gate (G6), and a fourth inverter (I4).

10. A pulse generator as claimed in claim 9, wherein said clearing circuit means (19) comprises a second clocked half-latch (20) and fifth inverter (22).

11. A pulse generator as claimed in claim 10, wherein said second clocked half-latch (20) comprises a pass transistor (N2) and sixth and seventh inverters (I5, I6).

12. A pulse generator as claimed in claim 11, wherein said detector latch means (24) comprises seventh and eighth cross-coupled NAND logic gates (G7, G8) and ninth NAND logic gate (G9).

13. A pulse generator as claimed in claim 1, further comprising resetting means (26) connected to said master latch means (12) for resetting said first latched signal to a low logic level.

14. A pulse generator as claimed in claim 13, wherein said resetting means (26) is also coupled to said detector latch means (24) for resetting said trigger signal to a high logic level.

15. A pulse generator for generating an output pulse which is synchronized to an internal clock pulse, comprising:

detector latch circuit means (24) responsive only to the positive edge of an asynchronous pulse of a varying width for generating a trigger signal which is latched to a low logic level;

master latch means (12) responsive to said trigger signal for generating a first latched signal which is latched to a high logic level;

clocked latch means (14) responsive to said first latched signal and a first internal clock pulse signal for generating a second latched signal which is latched to a high logic level;

first clocked half-latch means (16) responsive to said second latched signal and a second internal clock pulse signal for generating a control signal;

output logic circuit means (18) responsive to said first internal clock pulse signal and said control signal for generating an output pulse signal which is synchronized to said first internal clock pulse signal when control signal is at a low logic level; and clearing circuit means (19) responsive to said control signal and said first internal clock pulse signal for generating a clearing signal to reset said first latched signal to a low logic level.

16. A pulse generator as claimed in claim 15, further comprising resetting means (26) connected to said master latch means (12) for resetting said first latched signal to a low logic level.

17. A pulse generator as claimed in claim 16, wherein said resetting means (26) is also coupled to said detector latch means (24) for resetting said trigger signal to a high logic level.

18. A pulse generator for generating an output pulse which is synchronized to an internal clock pulse, comprising:

latch means (24, 12, 14, 16) responsive only to the positive edge of an asynchronous pulse of a varying width for generating a control signal having a low logic level; and output logic circuit means (18) responsive to said control signal and an internal clock pulse for generating an output pulse signal which is synchronized to the internal clock pulse signal.

19. A pulse generator as claimed in claim 18, wherein said latch means (24, 12, 14, 16) is further responsive to a clearing signal having a low logic level for resetting said control signal to the high logic level.

20. A pulse generator as claimed in claim 19, further comprising clearing circuit means (19) responsive to said control signal and said internal clock pulse signal for generating said clearing signal.

* * * * *